United States Patent
Fey et al.

(10) Patent No.: US 7,027,939 B2
(45) Date of Patent: Apr. 11, 2006

(54) METHOD AND CIRCUIT FOR DETECTING A FAULT OF SEMICONDUCTOR CIRCUIT ELEMENTS AND USE THEREOF IN ELECTRONIC REGULATORS OF BRAKING FORCE AND OF DYNAMICS MOVEMENT OF VEHICLES

(75) Inventors: Wolfgang Fey, Niedernhausen (DE); Mario Engelmann, Steinbach/Ts. (DE); Peter Oehler, Frankfurt-Höchst (DE)

(73) Assignee: Continental Teves AG&Co. OHG, Frankfurt (DE)

( * ) Notice: Subject to any disclaimer, the term of this patent is extended or adjusted under 35 U.S.C. 154(b) by 0 days.

(21) Appl. No.: 10/494,873

(22) PCT Filed: Oct. 24, 2002

(86) PCT No.: PCT/EP02/11886

§ 371 (c)(1),
(2), (4) Date: May 7, 2004

(87) PCT Pub. No.: WO03/039904

PCT Pub. Date: May 15, 2003

(65) Prior Publication Data
US 2004/0260501 A1     Dec. 23, 2004

(30) Foreign Application Priority Data
Nov. 9, 2001   (DE)   ................. 101 54 763

(51) Int. Cl.
*G06F 11/30*   (2006.01)

(52) U.S. Cl. .................. 702/64; 702/57; 702/58; 701/34

(58) Field of Classification Search .......... 702/30–32, 702/57, 58, 64, 65; 701/34; 327/108, 110, 327/362, 427, 434, 518, 538, 541, 543; 307/125, 307/131
See application file for complete search history.

(56) References Cited

U.S. PATENT DOCUMENTS

| | | | | |
|---|---|---|---|---|
| 5,041,817 A | * | 8/1991 | Reeb | 340/635 |
| 5,079,456 A | | 1/1992 | Kotowski et al. | |
| 5,107,427 A | * | 4/1992 | Peter et al. | 701/34 |
| 5,166,543 A | * | 11/1992 | Schneider et al. | 327/518 |
| 5,237,579 A | * | 8/1993 | Ema et al. | 372/31 |

(Continued)

FOREIGN PATENT DOCUMENTS

DE     4015625     11/1990

(Continued)

*Primary Examiner*—Carol S. Tsai (57) ABSTRACT

A circuit for detecting a defect of electronic components in an electronic control unit includes an output for driving a load (3). A redundant measurement of the current ($I_L$) is executed at the contacts (G, S, D), in particular at the driven contacts (S, D), of one or more semiconductor circuit elements, and an error function of a semiconductor circuit element is detected when the comparison of two current values ($I_S$, $I_{Sense1}$, $I_{Sense2}$) by way of the current flowing through a load (3, 3') indicates an unequal current distribution. This circuit is of use in electronic brake force or driving dynamics controllers for motor vehicles.

6 Claims, 5 Drawing Sheets

U.S. PATENT DOCUMENTS

| | | | |
|---|---|---|---|
| 5,374,857 A * | 12/1994 | Carobolante | 327/110 |
| 5,438,286 A * | 8/1995 | Pavlin et al. | 327/50 |
| 5,652,540 A * | 7/1997 | Eilley | 327/565 |
| 5,760,613 A * | 6/1998 | Pulvirenti et al. | 327/67 |
| 5,763,963 A * | 6/1998 | Zydek et al. | 307/130 |
| 5,801,573 A * | 9/1998 | Kelly et al. | 327/434 |
| 5,995,885 A * | 11/1999 | Pfeufer et al. | 701/29 |
| 6,169,335 B1 * | 1/2001 | Horsak et al. | 307/10.1 |
| 6,226,602 B1 | 5/2001 | Schmitt et al. | |
| 6,347,028 B1 * | 2/2002 | Hausman et al. | 361/93.1 |
| 6,377,109 B1 * | 4/2002 | Yama | 327/423 |
| 6,382,740 B1 * | 5/2002 | Peichl et al. | 303/122.08 |
| 6,545,515 B1 * | 4/2003 | Takahashi et al. | 327/110 |
| 2001/0054887 A1 * | 12/2001 | Baretich et al. | 323/284 |
| 2002/0014900 A1 * | 2/2002 | Swonger et al. | 327/108 |
| 2004/0042135 A1 * | 3/2004 | Strutt et al. | 361/18 |

FOREIGN PATENT DOCUMENTS

| | | |
|---|---|---|
| DE | 4213412 | 10/1992 |
| DE | 4213606 | 10/1992 |
| DE | 4237122 | 5/1994 |
| DE | 19604041 | 4/1997 |
| DE | 19623441 | 1/1998 |
| DE | 19825029 | 12/1998 |
| DE | 19812920 | 12/1999 |
| DE | 19838657 | 3/2000 |
| DE | 19854914 | 6/2000 |
| DE | 19924416 | 10/2000 |
| DE | 10057486 | 4/2001 |
| EP | 0227149 | 6/1992 |
| EP | 0599605 | 6/1994 |
| EP | 1103817 | 5/2001 |

* cited by examiner

METHOD AND CIRCUIT FOR DETECTING A FAULT OF SEMICONDUCTOR CIRCUIT ELEMENTS AND USE THEREOF IN ELECTRONIC REGULATORS OF BRAKING FORCE AND OF DYNAMICS MOVEMENT OF VEHICLES

BACKGROUND OF THE INVENTION

The present invention relates to a method of detecting a defect of semiconductor circuit elements, in particular of field effect semiconductor circuit elements, a circuit configuration, and an electronic controller with such a circuit configuration.

Electronic control devices for motor vehicle brake systems perform functions at an increasing rate that either contribute to driving safety or lately even comprise basic vehicle functions such as the braking function itself. Examples of functions for improving driving safety are anti-lock control (ABS) or driving dynamics control (ESP: Electronic Stability Program). The braking function as such is carried out by the electronic control unit of the brake in more recent electronic brake systems, such as the Electro-Hydraulic Brake (EHB) or the ElectroMechanical Brake (EMB). Therefore, ever increasing demands are placed on the reliability, failure tolerance and error handling of the electronic control units.

It is known in prior art to install safety devices in electronic control units for motor vehicle brake systems, which permit detecting any occurring defects of the electronic components contained in the control units. Upon detection of such a defect, appropriate countermeasures such as the deactivation of the control unit or switch-over of the control unit into an emergency mode may be taken. Safety-relevant circuit parts may have a double or multiple (redundant) design to identify defects. Errors arising can be detected in many cases by comparing the functioning of the multiply provided circuit parts.

Semiconductor circuit elements such as power field effect transistors (power MOSFET's, FET's) are employed among others for actuating the electromechanical hydraulic valves provided to control the brake pressure.

SUMMARY OF THE INVENTION

The method of the invention being implemented in an electronic control unit, in particular for brake or driving dynamics controllers, permits detecting a fault of electronic components, such as FET's, which are associated with at least one power driver stage and at least one recirculation driver stage. The power driver stage and the recirculation driver stage preferably comprise electronic components such as, especially, one or more semiconductor circuit elements and/or one or more current measuring devices.

Preferably, one power driver stage is respectively connected to a load, said load especially being an inductive load, e.g. a valve coil.

It is preferred to use sense semiconductor circuit elements as semiconductor circuit elements for measuring the current. These sense semiconductor circuit elements are preferably Sense FET's.

Redundant current measurement relates to the testing of the current in a redundant circuit arrangement with at least two current measuring devices, and said current measuring devices can be arranged in parallel or in series to one another.

Apart from a measurement of the current at the output of a semiconductor circuit element, for example, the measurement of the drain-source current in a FET, it can also be expedient for monitoring the proper functioning of this semiconductor to determine the current between the control line of the semiconductor circuit element and one of the outputs, e.g. the gate-source current.

Beside the multiple design of individual components for the purpose of redundant current measurement, it can be expedient in addition to use at least two semiconductor circuit elements that drive the same output in order to increase the safety in operation. It is then possible to perform an individual current measurement especially on each of these elements. Preferably, the control line of the semiconductor circuit elements is driven jointly by one signal input with these semiconductor circuit elements that drive a common output. When one or more of these semiconductor circuit elements drive induction currents of inductive loads connected to the output, this also signifies an actuation of one output with several semiconductor circuit elements.

When a fault of a component is detected according to the method of the invention, it is preferred to take one or more of the measures out of the group—activation of a spare component for the semiconductor element that failed, disabling of the brake control system,—activation of a partial operation or—display of an error signal on the instrument panel.

The invention also relates to a circuit comprising one or more semiconductor circuit elements each with control contacts for connecting a control line, with current contacts for connecting preferably inductive loads (e.g. valve coils) and a current measuring device for determining the current ($I_L$ or $I_{LS}$) conducted through the semiconductor circuit element, in particular for implementing the method of the invention as described hereinabove, wherein at least two separate current measuring devices are provided, optionally with one or more joint components ($R_s{}^*$), in particular, elements of a resistor, for a redundant current measurement.

Favorably, current measurement is determined by measuring the voltage drop across resistor elements. When integrated on a substrate, resistor elements can be on-chip resistors or, preferably, discrete resistor elements, and it is possible to manufacture the last mentioned resistor elements with lower tolerances compared to on-chip resistors.

The invention also relates to electronic brake force or driving dynamics controllers for motor vehicles which include a circuit as described above.

Preferred embodiments of the invention can be taken from the sub claims and the subsequent description of the Figures comprising several embodiments according to the invention.

DETAILED DESCRIPTION OF THE DRAWINGS

Figure 1:
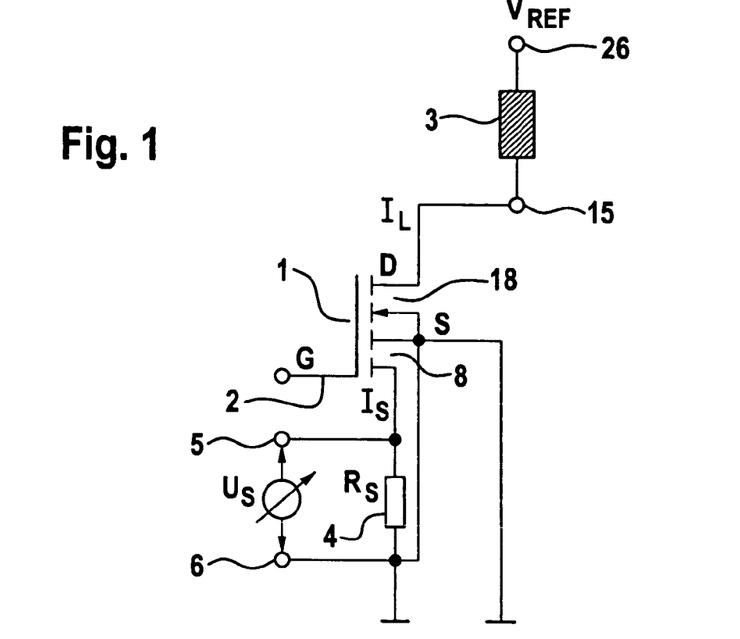
FIG. 1 is a circuit with a Sense FET for driving a load, equipped with a current measuring device.

In the circuit according to FIG. 1, a Sense FET 1 is connected to terminal 15 leading to a load 3 (e.g. valve coil). A current $I_L$ flows through load 3 according to the gate voltage at gate G. The second connection of the load (terminal 26) is connected to the positive potential $V_{REF}$ with a voltage relative to the reference potential $V_{REF}$. The additional sense output of a Sense FET 1 in which the considerably lower sense current $I_S$ flows can be used to measure the output current. To convert the current into a voltage signal $U_S$, the sense output is conducted through resistor $R_S$ to the reference potential.

The mode of operation of a Sense FET can e.g. be seen in U.S. Pat. No. 5,079,456 or patent application DE 195 20 735 A1. Accordingly, the load current of a power FET 18 can be sensed in that connected in parallel and in direct vicinity to the power FET 18 on the semiconductor material is a similar FET 8 having a smaller surface. Current $I_s$ that flows through the smaller FET is largely proportional to the load current of the power FET, however, current $I_s$ is lower than the load current by a structurally defined numerical ratio, corresponding substantially to the ratio of chip surface used between power FET and Sense FET.

Figure 2:
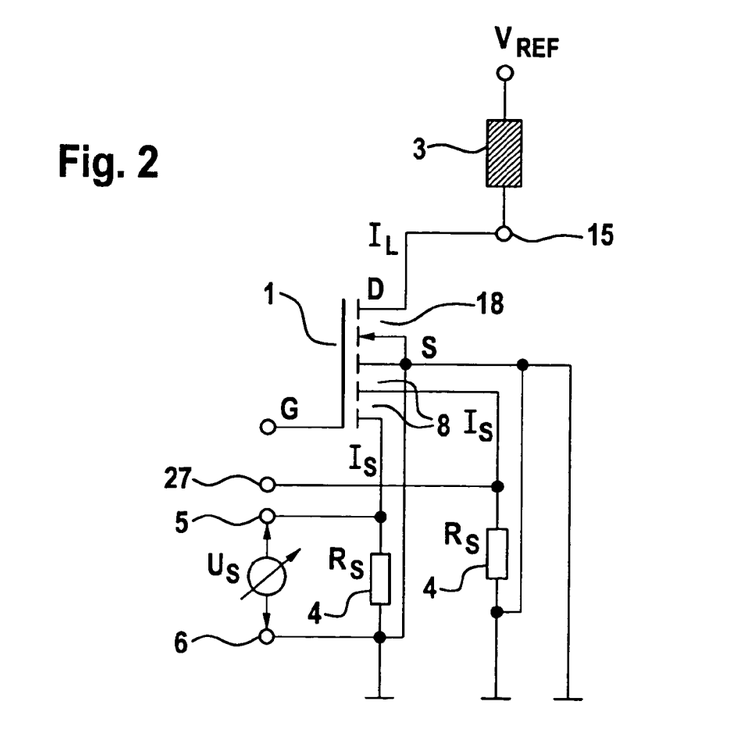
FIG. 2 is a circuit for driving a load with a redundant current measuring device.

A Sense FET is illustrated in FIG. 2, which comprises two redundant Sense FET regions 8 in contrast to the Sense FET in FIG. 1. Both Sense FET regions are respectively carried through an own measuring resistor 4 ($R_s$) to the reference potential so that redundant current measurement can be performed. The voltage $U_s$ that is proportional to the load current can be tapped between terminals 5 and 6 and between terminals 27 and 6.

Figure 5:
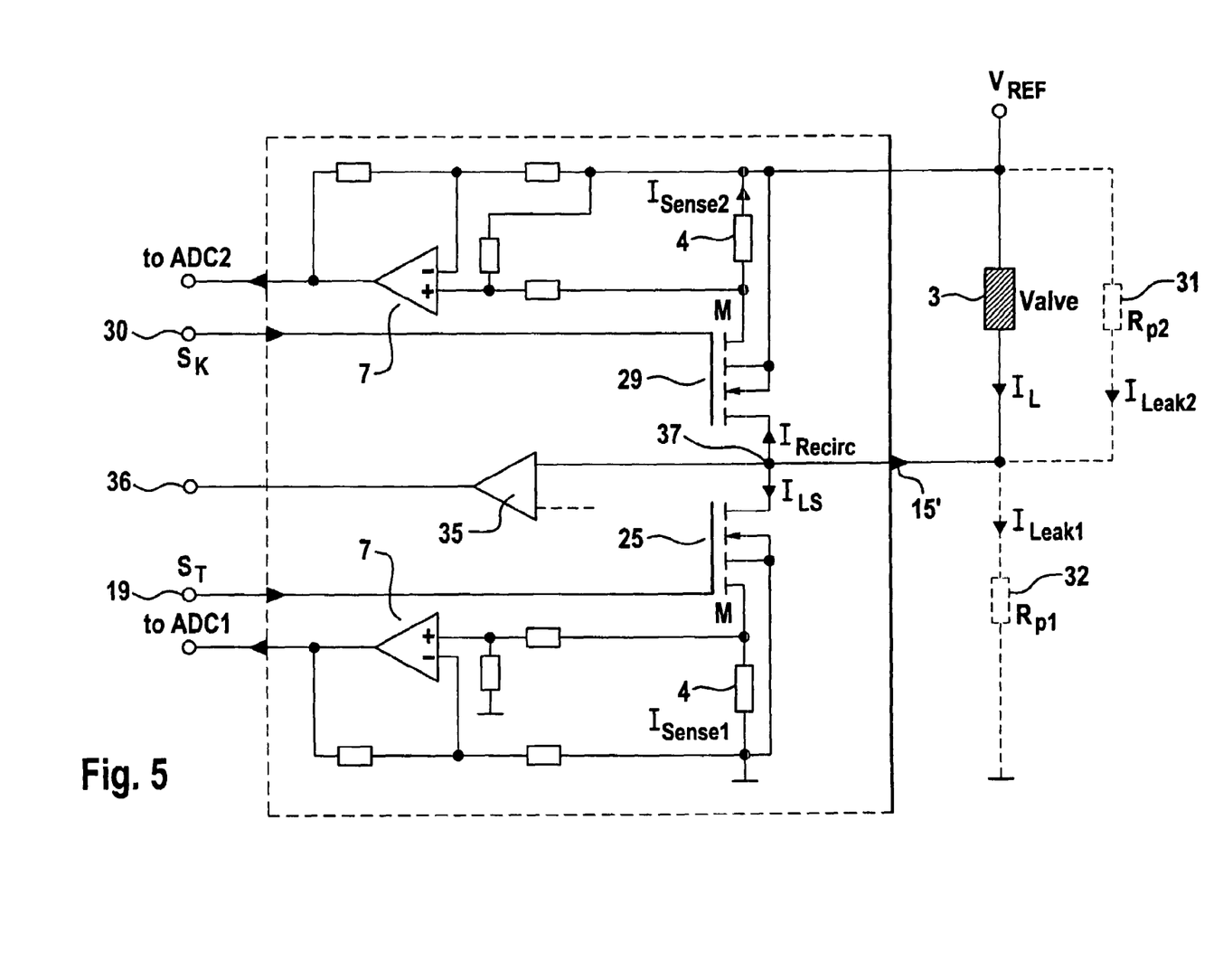
FIG. 5 is a circuit with a recirculation driver.

However, in contrast to the circuit according to FIG. 5, the circuit illustrated herein is limited to the detection of errors of the measuring resistor 4 or faults of the Sense FET, which also extend to the Sense FET region of the semiconductor, i.e. in the event of complete melt of the component.

Figure 3:
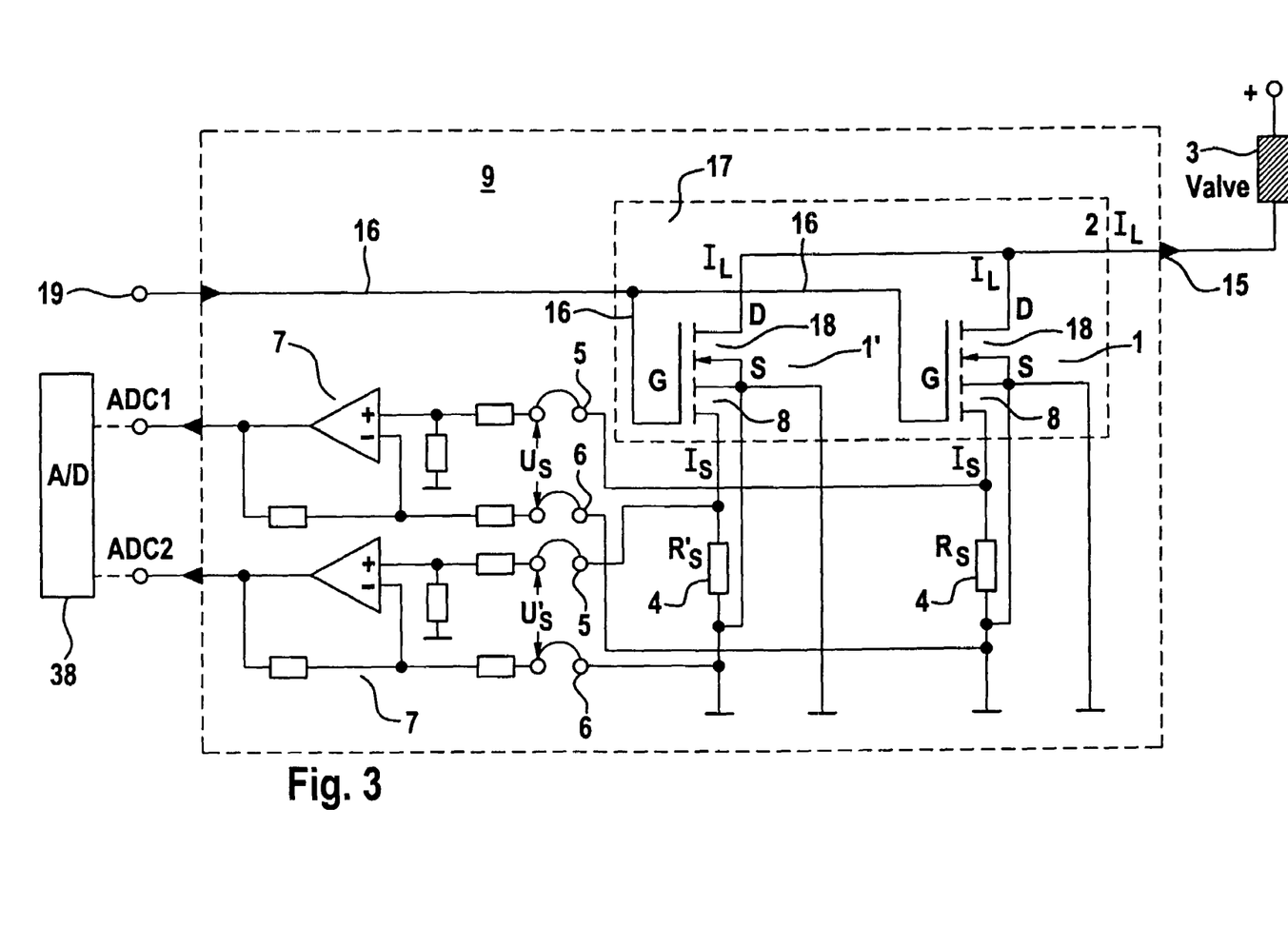
FIG. 3 is a circuit with parallel connected Sense FET's with respectively one current measuring device.

The circuit in FIG. 3, wherein all essential components are grouped on a semiconductor substrate 9, comprises two parallel connected Sense FET's 1 and 1' for driving a load 3. The dotted frame 17 emphasizes that Sense FET's 1 and 1' can be seen as a common driver stage.

Besides circuit elements 1 and 1', substrate 9 comprises two current measuring devices 7 made up of reference resistors 4 and signal amplifiers 7 allowing the measurement of the respective voltages that drop across resistors 4. The measured voltages can then be carried through outputs ADC1 and ADC2 to one or more A/D converters 38. Terminal 15 of the circuit is connected as a low-side actuator to load 3. Terminal 15 leads on the substrate to the drain zones D of the Sense FET's 1 and 1'. Gates G of the Sense FET's are led jointly through control lines 16 to terminal 19, through which a control signal can be supplied by a logic (not shown). Discrete resistor elements $R_S$, $R_S$ are respectively coupled to the Sense FET regions of the circuit elements 1 and 1' for generating a voltage proportional to the current. The voltage declining across resistors $R_s$ can finally be tapped by means of amplifier stages 7.

Sense FET's 1 and 1' in FIG. 3 are favorably not arranged directly side by side on the semiconductor substrate so that a defect of one semiconductor element and the local heat developing due to said defect will not cause any defect of the other semiconductor element.

Figure 4:
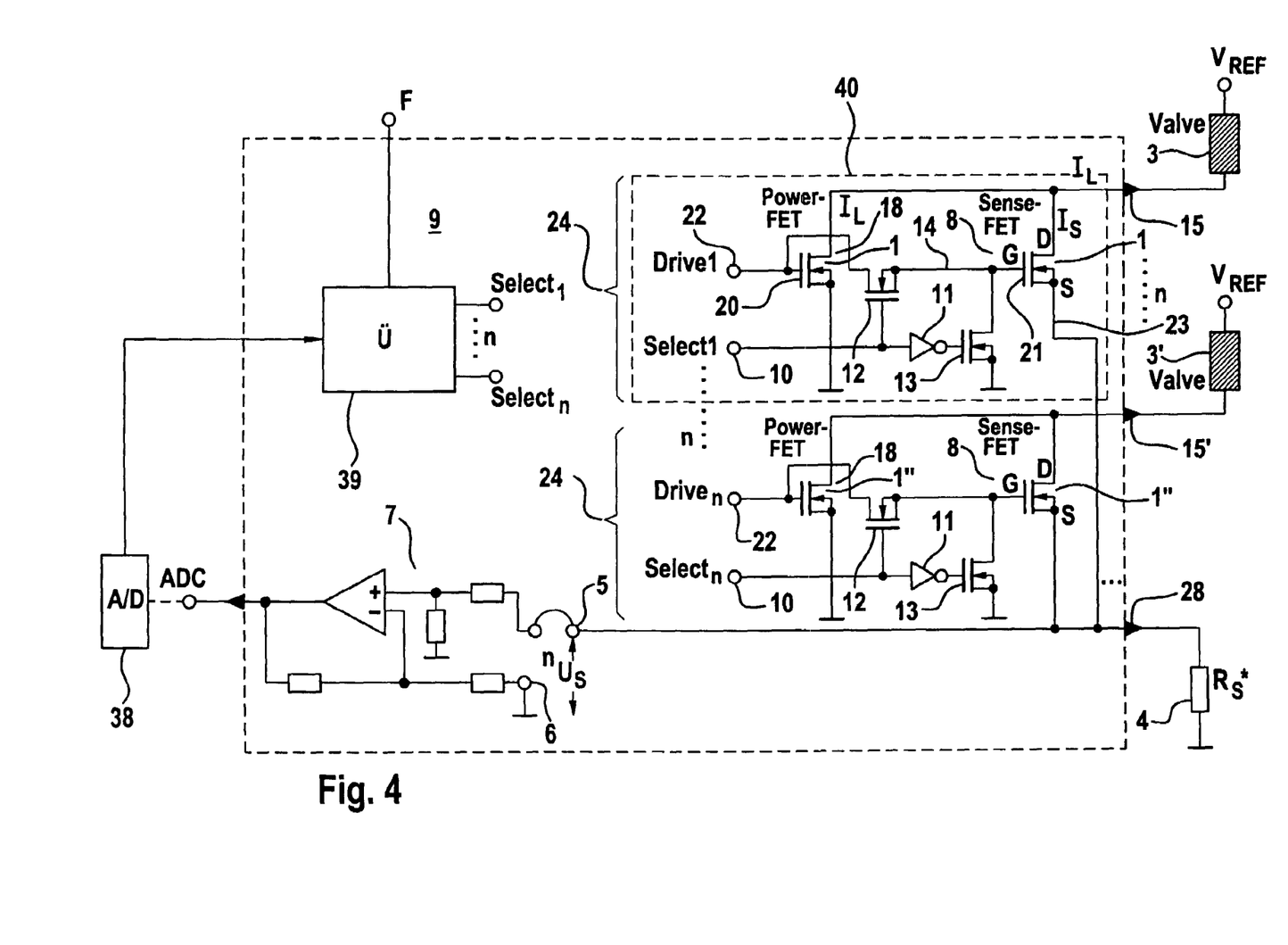
FIG. 4 is a circuit for driving several loads, equipped with current measuring devices and an external reference resistor.

The circuit in FIG. 4 shows an embodiment with several drivers 24 for driving respectively one of the loads 3, 3' associated with the driver. Herein, like in FIG. 3, the loads are driven by means of Sense FET's, however, herein a presentation of the Sense FET's 1 and 1' is used which is broken down and differs from FIG. 3 for reasons of clarity, as will be explained hereinbelow. In FIG. 4, the sense current section 8 of the Sense FET 1 is illustrated as an independent FET symbol. The load current section 18 of the power FET 1 is also characterized as a separate FET symbol.

In contrast to FIG. 3, current measurement is executed by using an external discrete measuring resistor 4 allowing to connect the sense sections 8 of the n-fold provided (n>1) Sense FET's 1, 1' to terminal 10 (Select) by way of a signal in a selectable manner. To select the Sense FET region, gate 20 of the power FET 18 is coupled to gate 21 of the sense current section 8 of the Sense FET 1 by way of an additional FET 12 (pass transistor). Further, there is a connection between gate 20 and a driving port 22 (Drive1). The gate of FET 12 leads to selecting port 10 (Select1) and through inverter 11 to the gate of FET 13. The source-port of FET 13 is connected to the reference potential. The drain-port of FET 13 is coupled to the gate of the sense current section 8. The drain-ports of the load current section 18 and of the sense current section 8 are jointly conducted to terminal 15. Source-port 23 is connected to reference resistor 4 by way of terminal 28. Terminal 28 leads to amplifier 7 providing a signal at output ADC of the circuit that can be processed further. The signal at output ADC is then proportional to the respectively selected coil current in the event of proper functioning of the circuit. Terminal ADC is connected to an A/D converter that provides a digital signal to a digital monitoring circuit 39 having select outputs by means of which the Sense FET's in the driver stages can be selected.

In the operation of the circuit of FIG. 4, the signal carried through output ADC indicates the current by means of that coil that is selected by a high-level at terminal 10, while a low-level must be applied at that time to the other terminals of the remaining assemblies 24. The selection of the driver stage 40 by means of a 'high'-level at terminal 10 causes opening of FET 13 and closing of FET 12. This activates the sense current section of FET 1 so that sense current Is flows through resistor 4. With a 'low'-level at terminal 10, the sense current section 8 will be deactivated so that current measurement can be executed by a 'high'-level at terminal 10 at one of the remaining assemblies 22.

As illustrated in FIG. 3, the Sense FET 1 in one single driver stage can also be replaced by two parallel connected Sense FET's 1 and 1' corresponding to the embodiment in FIG. 3 or by a 'series connection' like in FIG. 5 for the purpose of enhancing the redundancy. The resistor elements 4 can also be designed redundantly in the way of several discrete components arranged outside the substrate.

When an unequal current distribution, as illustrated in FIG. 3, is detected by means of the method of the invention by comparison of the currents measured at the Sense FET's 1 and 1' in the monitoring device 39, an error signal is outputted at terminal F (FIG. 4).

FIG. 5 schematically indicates a circuit for driving an inductive load 3, wherein besides a driver stage 25 for driving the load 3, there is additional provision of a recirculation driver stage 29.

The circuit described herein is advantageous in comparison to the circuit of FIG. 3 because faults of the power section in the Sense FET can additionally be detected, which e.g. have a gradual or abrupt change in the switching resistance $R_{DSon}$ as a result. In addition, a fault in the Sense FET of the recirculation stage can be detected accordingly.

Figure 6:
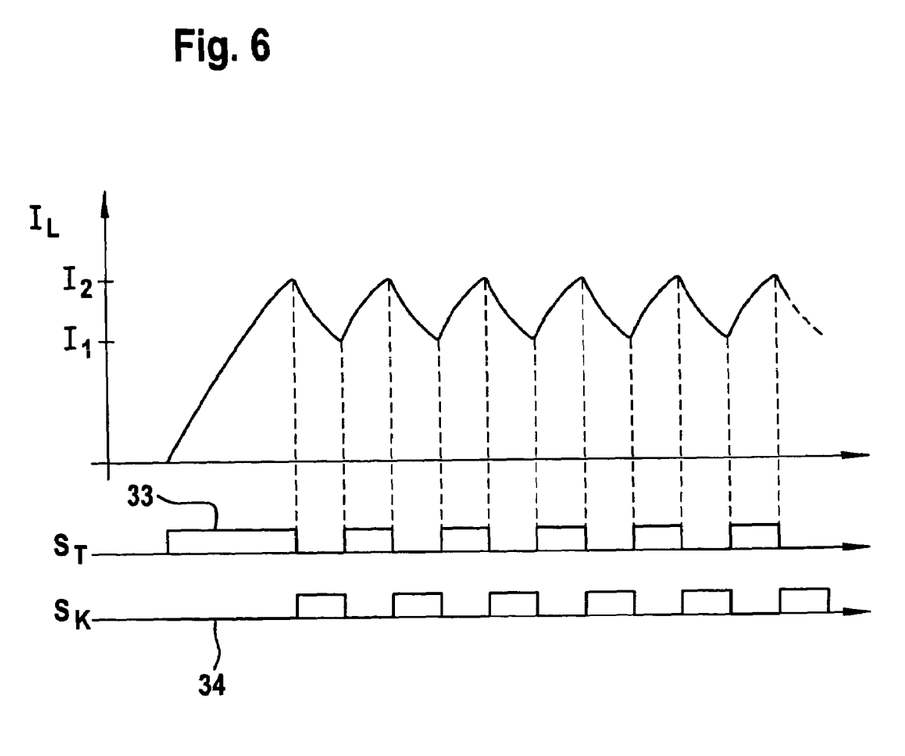
FIG. 6 is a diagram with current and signal courses of the circuit for explaining the circuit according to FIG. 5.

The mode of operation of the circuit is explained by way of FIG. 6. By driving the driver stage 25 by means of a square-wave signal 33 at terminal 19, the induction current $I_L$ (freewheeling current) prevailing in the pulse pause due to the coil inductance can be fed back into the coil by way of the recirculation stage 29. To this end, the recirculation stage 29 is driven by a signal 34 that is complementary to signal 33 at terminal 30.

Driver stage 25 and recirculation stage 29 may expediently comprise one or more FET's.

Driving the driver 25 can take place corresponding to the circuit described hereinabove in FIG. 3 by way of a logic through terminal 19, which is connected to the driving line of a semiconductor circuit element. A signal complementary to the signal applied to terminal 19 is sent through terminal 30.

It is essential that both driver stage 25 and recirculation stage 29 comprise each one of the previously described current measuring devices (e.g. one Sense FET in each stage). When the coil is driven according to the principle of pulse width modulation (PWM), this allows redundantly determining the current that flows through the coil. Compared to the parallel arrangement of the Sense FET according to FIG. 3, the circuit includes the advantage that semiconductor defects can additionally be detected, where a change of the switching resistance $R_{DSon}$ occurs. Under the assumption that a corresponding defect happens only in one of the existing semiconductor circuit elements (simple fault), a defect can be detected by a comparison of the current through the driver stage during the driving phase with the freewheeling current through the recirculation stage during the driving pause.

Current can be measured corresponding to FIG. 3 by tapping the voltages at the measuring resistors 4, and the tapped voltage signals can be amplified by amplification stages 7 also herein and relayed to one or more analog-digital converters 38 through outputs ADC1 and ADC2.

The circuit described hereinabove allows detecting deviations between driving current and freewheeling current. Deviations can develop when the measured current in the driver stage or in the recirculation stage does not coincide with the actual coil current. In this case, a defect of one of the Sense FET's is likely, what causes e.g. deactivation of the anti-lock system. The circuit according to FIG. 5 renders it possible to detect apart from semiconductor defects also shunts, represented by resistors 31 ($R_{p2}$) and 32 ($R_{p1}$), which occur due to a defect either in parallel to the driver stage or in parallel to the recirculation stage.

In the event of a shunt corresponding to a resistor 32, the current $I_{Sense1} \approx I_{LS} = I_L + I_{Leak1}$ is measured by Sense FET 25, wherein $I_L$ is the current through coil 3 and $I_{Leak1}$ is the leakage current through resistor 32. The result due to the parallel connection $R_{DSon}$ and $R_{P1}$ is that $I_{Sense1}$ also comprises the current $I_{Leak1}$. Assuming that a voltage of e.g. 1 volt maximally can drop across driver 25, $I_{Leak1} < 1\ V/R_{p1}$ will result. Assuming that a voltage of maximally about 1 volt can also drop across the recirculation stage, a recirculation current $I_{sense2} \approx I_{Recirc} = I_L - I_{Leak1}$, with $I_{Leak1} < (V_{REFx}+1\ V)/R_{p1}$ will be produced after the deactivation of FET 25. This shows that, with a positive leakage current $I_{Leak1}$ across resistor 32 with a shunt of the driver 25, the driver current determined by the Sense FET is increased and the measured recirculation current $I_{Recirc}$ in Sense-FET 29 is decreased so that a difference in current between $I_{sense1}$ and $I_{sense2}$ is produced, which can be detected by the circuit.

In the case of a shunt in parallel to the recirculation stage, symbolized by resistor 31 ($R_{p2}$), a higher current $I_{LS} = I_L + I_{Leak2}$ is required during the driving phase than this would be the case without a shunt. In this case, too, the relation $I_{Leak2} > (V_{REF}-1\ V)/R_{p2}$ applies in a maximum voltage drop of 1 volt at the driver stages. During the coasting phase, when the coil current discharges through step 29, a current $I_{Sense2} \approx I_L = I_{Recirc} - I_{Leak2}$, with $I_{Recirc} > -1\ V/R_{p2}$, is measured in the Sense FET of this stage. A too low current Isense2 is measured by the parallel connection of the switch-on resistor $R_{DSon}$ in the transistor of the recirculation driver and the resistor $R_{p2}$. Consequently, the result is a current difference between $I_{sense1}$ and $I_{sense2}$, which can be detected by the circuit.

The method described in the preceding paragraph permits detecting shunts, under the precondition that resistor 32 is greater than zero. Fault detection by way of the current difference $I_{sense1}$ and $I_{sense2}$ alone is not possible in the case of short-circuit in parallel to the driver stage 25 or of the Sense FET itself. Therefore, it is preferred that a monitoring circuit with a comparator 35 is additionally provided in the circuit according to FIG. 5, which comparator monitors terminal 15' (coil output) as to whether the voltage potential falls below a predetermined value. Even this case of fault which has not been identifiable so far, can be detected by the circuit by additionally monitoring the signal at terminal 36 alternating from 'high' to 'low' when the mentioned short-circuit occurs.

The invention claimed is:

1. A method of detecting a defect of electronic components in an electronic control unit with one or more outputs (15, 15') for the driving of loads (3, 3'), wherein redundant measurement of the current ($I_L$) flowing through the semiconductor circuit element is executed at the contacts (G,S,D), in particular at the driven contacts (S,D), of one or more semiconductor circuit elements, and an error function of a semiconductor circuit element is detected when the comparison of two current values ($I_S$, $I_{Sense1}$, $I_{Sense2}$) by way of the current flowing through a load (3, 3') indicates an unequal current distribution, wherein at least one of the gate potential and the drain potential (37) of semiconductor circuit elements is determined by comparison with a nominal potential, and a circuit defect is considered to prevail when a deviation is detected.

2. A circuit comprising one or more semiconductor circuit elements (1, 1', 1", 25, 29) with control contacts (G) for connecting a control line (2, 16), with current contacts (S, D) for connecting one or more loads (3, 3') and at least one current measuring device (4, 5, 6, 7, 8) for determining the current ($I_S$) conducted through the semiconductor circuit element, in particular for implementing the method as claimed in claim 1, wherein the current ($I_L$) led to a load (3, 3') and the current ($I_{Recirc}$) fed back from this load into the circuit is determined by at least two current measuring devices associated with the same load, and a comparison device (38, 39) is provided which compares the currents measured by the current measuring devices, wherein the current measuring devices comprise Sense semiconductor circuit elements (1, 1', 25, 29) and the sense semiconductor circuit elements are integrated on one joint semiconductor material (9), and one joint selectable reference element ($R_S^*$) in particular a reference resistor, which is not intergrated on the semiconductor material is provided for current determination.

3. A circuit comprising one or more semiconductor circuit elements (1, 1', 1", 25, 29) with control contacts (G) for connecting a control line (2, 16), with current contacts (S, D) for connecting one or more loads (3, 3') and at least one current measuring device (4, 5, 6, 7, 8) for determining the current ($I_S$) conducted through the semiconductor circuit element, in particular for implementing, the method as claimed in claim 1, wherein the current ($I_L$) led to a load (3, 3') and the current ($I_{Recirc}$) fed back from this load into the circuit is determined by at least two current measuring devices associated with the same load, and a comparison device (38, 39) is provided which compares the currents measured by the current measuring devices, wherein for current measurement the voltage drop across the reference element ($R_S^*$) is determined, and each semiconductor circuit element in turn can be connected so as to be conductive to the reference element by means of a connecting circuit (10 . . . 13).

4. A circuit comprising one or more semiconductor circuit elements (1, 1', 1", 25, 29) with control contacts (G) for connecting a control line (2, 6), with current contacts (S, D) for connecting one or more loads (3, 3') and at least one current measuring device (4, 5, 6, 7, 8) for determining the current ($I_S$) conducted through the semiconductor circuit element, in particular for implementing the method as claimed in claim 1, wherein the current ($I_L$) led to a load (3, 3') and the current ($I_{Recirc}$) fed back from this load into the circuit is determined b at least two measurin devices associated with the same load, and a comparison device (38, 39) is provided which compares the currents measured by the current measuring devices, wherein at least two loads (3, 3') are driven by respectively one driver associated with the load, and each driver includes at least one sense semiconductor circuit element whose sense current section (8) is connectable by way of a selecting port (10).

5. A circuit comprising one or more semiconductor circuit elements (1, 1', 1", 25, 29) with control contacts (G) for connecting a control line (2, 16), with current contacts (S, D) for connecting one or more loads (3, 3') and at least one current measuring device (4, 5, 6, 7, 8) for determing the current ($I_S$) conducted throu h the semiconductor circuit element, in particular for implementing the method as claimed in claim 1, wherein the current ($I_L$) led to a load (3, 3') and the current ($I_{Recirc}$) fed back from this load into the circuit is determined by at least two current measuring devices associated with the same load, and a comparison device (38, 39) is provided which compares the currents measured by the current measuring devices, wherein the semiconductor circuit elements (1, 1') are connected to a joint output (15) so as to be conductive in such a manner that, upon failure of one semiconductor circuit element (1'), the operable semiconductor circuit element (1') will take over the switching function of the failing semiconductor circuit element (1).

6. An electronic controller for motor vehicles comprising a circuit with one or more semiconductor circuit elements (1, 1', 1", 25, 29) with control contacts (G) for connecting a control line (2, 16), with current contacts (S, D) for connecting one or more loads (3, 3') and at least one current measuring device (4, 5, 6, 7, 8) for determining the current ($I_S$) conducted through the semiconductor circuit element, wherein the current ($I_L$) led to a load (3, 3') and the current ($I_{Recirc}$) fed back from this load into the circuit is determined by at least two current measuring devices associated with the same load, and a comparison device (38, 39) is provided which compares the currents measured by the current measuring devices wherein the current measuring devices comprise Sense semiconductor circuit elements (1, 1', 25, 29) and the sense semiconductor circuit elements are integrated on one joint semiconductor material (9), and one joint selectable reference element ($R_S^*$), in art cular a reference resistor, which is not integrated on the semiconductor material is provided for current detemination.

* * * * *